(12) United States Patent
Probasco et al.

(10) Patent No.: US 8,360,370 B2
(45) Date of Patent: Jan. 29, 2013

(54) PANEL DOCK

(75) Inventors: Max A. Probasco, Plano, TX (US);
Steve Ruzic, Garland, TX (US)

(73) Assignee: AirGizmos, LP, Richardson, TX (US)

( * ) Notice: Subject to any disclaimer, the term of this patent is extended or adjusted under 35 U.S.C. 154(b) by 650 days.

(21) Appl. No.: 12/401,565

(22) Filed: Mar. 10, 2009

(65) Prior Publication Data
US 2010/0230549 A1 Sep. 16, 2010

(51) Int. Cl.
| | |
|---|---|
| G12B 9/00 | (2006.01) |
| E04G 3/00 | (2006.01) |
| A45F 5/00 | (2006.01) |
| G06F 1/16 | (2006.01) |
| H05K 5/00 | (2006.01) |
| H05K 7/00 | (2006.01) |

(52) U.S. Cl. ......... 248/27.3; 248/309.1; 248/291.1; 248/917; 248/922; 248/923; 248/288.11; 224/185; 224/547; 361/679.3; 361/679.21; 361/679.23; 361/679.28; 361/679.29; 361/679.06

(58) Field of Classification Search ........... 248/27.3, 248/309.1, 291.1, 917, 922, 923, 288.11; 224/185, 547; 361/67.02, 679.21, 679.23, 361/679.28, 679.29, 679.3, 679.06
See application file for complete search history.

(56) References Cited

U.S. PATENT DOCUMENTS

| | | | | |
|---|---|---|---|---|
| 3,789,140 A | * | 1/1974 | McQueen et al. | ............ 348/827 |
| 5,633,782 A | | 5/1997 | Goodman et al. | |
| 5,765,794 A | * | 6/1998 | Chen | .......... 248/292.12 |
| 5,899,421 A | | 5/1999 | Silverman | |
| 5,996,956 A | * | 12/1999 | Shawver | .............. 248/309.1 |
| 6,113,050 A | | 9/2000 | Rush | |
| 6,199,810 B1 | * | 3/2001 | Wu et al. | ............ 248/291.1 |
| 6,525,929 B2 | * | 2/2003 | Carr | .......... 361/679.02 |
| 6,532,628 B2 | * | 3/2003 | Kim | ................ 16/342 |
| 6,554,239 B2 | | 4/2003 | Stiley et al. | |
| 6,598,845 B1 | | 7/2003 | Higgins | |
| 6,663,072 B1 | | 12/2003 | Ritchey et al. | |
| 6,788,528 B2 | | 9/2004 | Enners et al. | |
| 7,201,356 B2 | * | 4/2007 | Huang | ............. 248/309.1 |
| 7,261,270 B2 | | 8/2007 | Chen et al. | |
| 7,614,594 B2 | * | 11/2009 | Baek et al. | .............. 248/274.1 |
| 7,694,929 B2 | * | 4/2010 | Jang | ............. 248/372.1 |
| 7,712,717 B2 | * | 5/2010 | Burns | ............. 248/291.1 |
| 7,731,137 B2 | * | 6/2010 | Lee et al. | ............. 248/157 |
| 2003/0174259 A1 | * | 9/2003 | Yang | ................. 349/58 |
| 2006/0011332 A1 | | 1/2006 | Inoue et al. | |
| 2006/0145039 A1 | | 7/2006 | Shawver | |
| 2007/0205334 A1 | * | 9/2007 | Kim | ............. 248/27.1 |
| 2008/0210837 A1 | * | 9/2008 | Burns | ............. 248/291.1 |
| 2010/0158300 A1 | * | 6/2010 | Wang | ............. 381/333 |
| 2010/0230549 A1 | * | 9/2010 | Probasco et al. | ............. 248/27.1 |

FOREIGN PATENT DOCUMENTS

JP 11198732 A 7/1999

* cited by examiner

*Primary Examiner* — Terrell McKinnon
*Assistant Examiner* — Christopher Garft
(74) *Attorney, Agent, or Firm* — Shannon W. Bates; Klemchuk Kubasta LLP

(57) ABSTRACT

A panel dock has a body, a retainer, and a bracket. The retainer is rotably secured to the body and includes a shaft having at least one arm extending from the shaft and at least one finger extending from the shaft. The bracket is attachable to an electronic device. The bracket includes a bar sized to be secured between the arm and the finger.

6 Claims, 9 Drawing Sheets

PANEL DOCK

The disclosure relates generally to equipment for retaining electronic devices, and in particular to equipment for retaining electronic devices to a panel, such as in a vehicle.

BACKGROUND

Electronic devices are often used in vehicles where proper retention would be desirable.

SUMMARY

Embodiments of the present disclosure generally provide equipment for removably mounting electronic equipment in a panel, such as an instrument panel found in vehicles.

A panel dock is disclosed, the panel dock comprising a body, a retainer, and a bracket. The retainer is rotably secured to the body and includes a shaft having at least one arm extending from the shaft and at least one finger extending from the shaft. The bracket is attachable to an electronic device. The bracket includes a bar sized to be secured between the arm and the finger.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

The present disclosure generally provides equipment for removably mounting an electronic device in a panel, such as an instrument panel in a vehicle.

Figure 1:
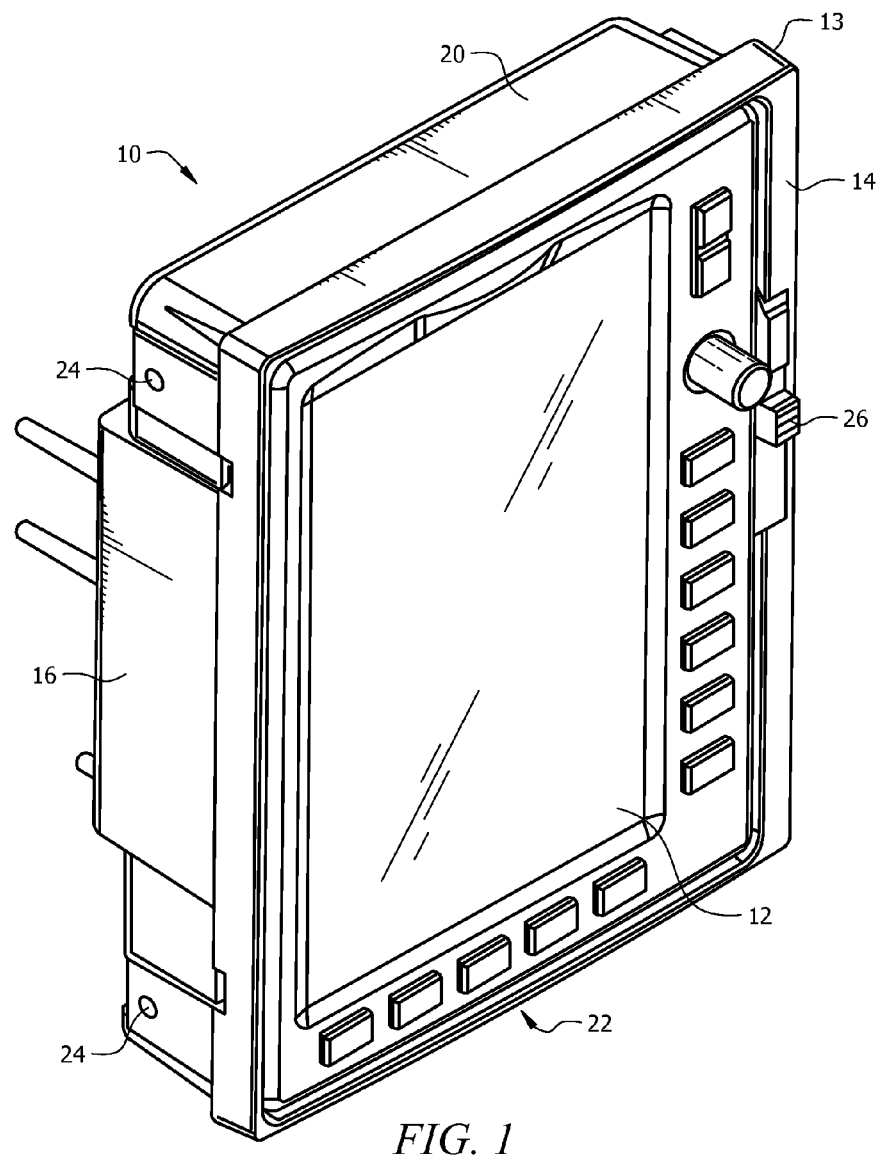
FIG. 1 is a front isometric view of a panel dock with an electronic device in an engaged position.

FIG. 1 is a front isometric view of a panel dock 10 with an electronic device 12 in an engaged position. The panel dock has a body 13 with a face 14. Body 13 further comprises a first side 16 and an opposite second side 18 (not visible in this figure) extend rearward from the face 14. Body 13 also includes a top 20 and opposite bottom 22 also extend rearward from the face 14. Electronic device 12 is shown generally flush with face 14 while in the engaged position. A plurality of mounting holes 24 are shown in side 16. Mounting holes 24 accept fasteners (not shown) for securing the panel dock 10 to a panel (not shown), such as an instrument panel in a vehicle. Thumb wheel 26 extends through face 14 to allow operation of a retainer 28 shown and discussed in more detail below.

Figure 2:
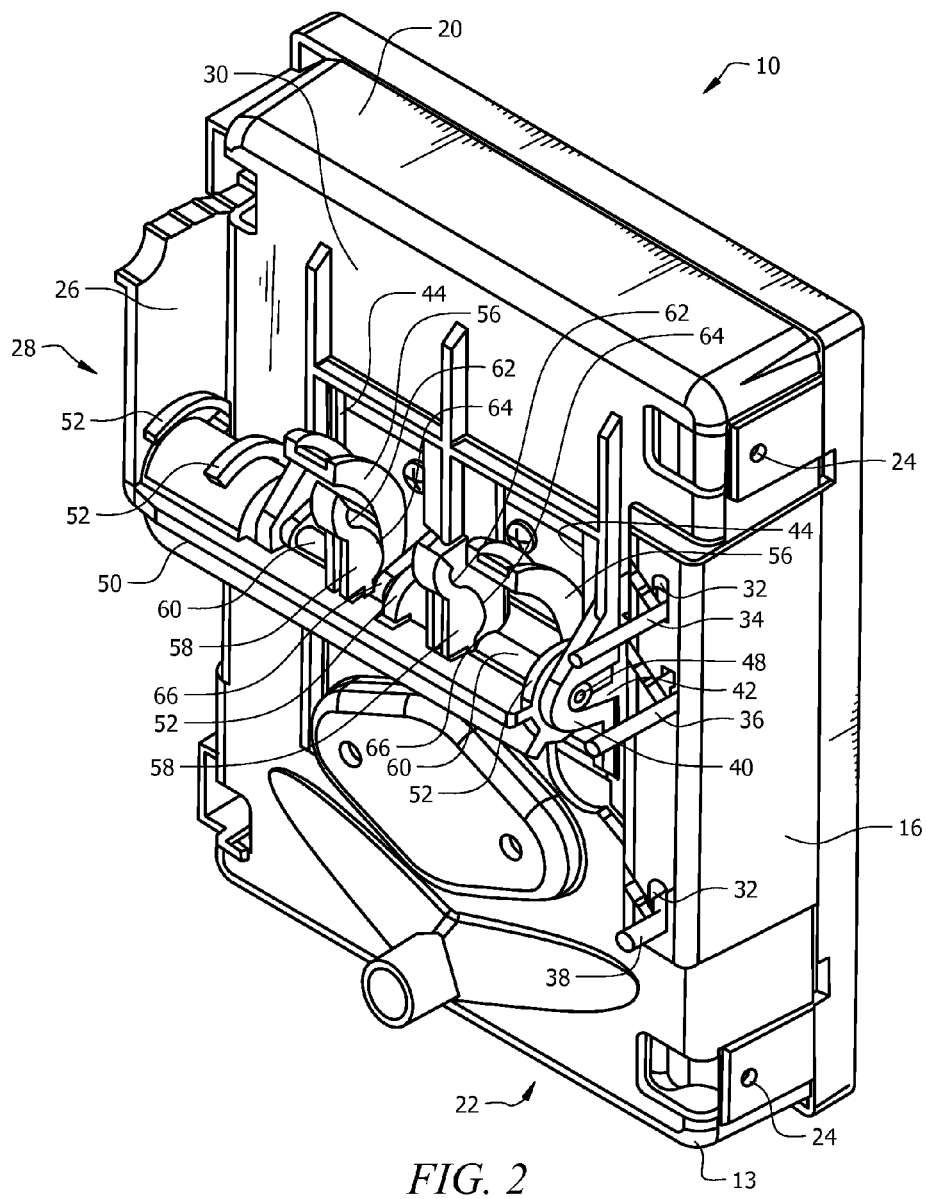
FIG. 2 is a rear isometric view of a panel dock with an electronic device in an engaged position.

FIG. 2 is a rear isometric view of a panel dock 10 with an electronic device 12 (not visible in this view) in an engaged position. Body 13 further includes a rear 30. Side 16 and top 20 extend from face 14 to rear 30. Rear 30 has keyholes 32 near side 16. Electronic device 12 is shown with a wire 34, wire 36, and wire 38 extending from electronic device 12 through keyholes 32.

Retainer supports 40 extend rearward from rear 30 and include slots 42. Near retainer supports 40 are holes 44 in rear 30. A retainer 28 is rotably attached to panel dock 10 at retainer supports 40 such that portions of retainer 28 may extend through holes 44 upon rotation as discussed in more detail below.

Retainer 28 has pins 48 that mate with slots 42 pins 48 are connected by shaft 50 that runs parallel to the axis of pins 48. Cams 52 along shaft 50 mate with bearing surfaces 54 formed in rear 30. Pins 48 in conjunction with cams 52 and bearings 54 (shown and discussed below) work in conjunction to allow and control the rotation of retainer 28 through a predetermined range of motion. Extending from shaft 50 are arms 56 and opposing fingers 58. Together, arms 56 and fingers 58 trap, retract, and retain a bar 60 as retainer 28 is rotated from a disengaged position to the engaged position shown. Retainer 28 is rotated by movement of thumb wheel 26.

Figure 3:
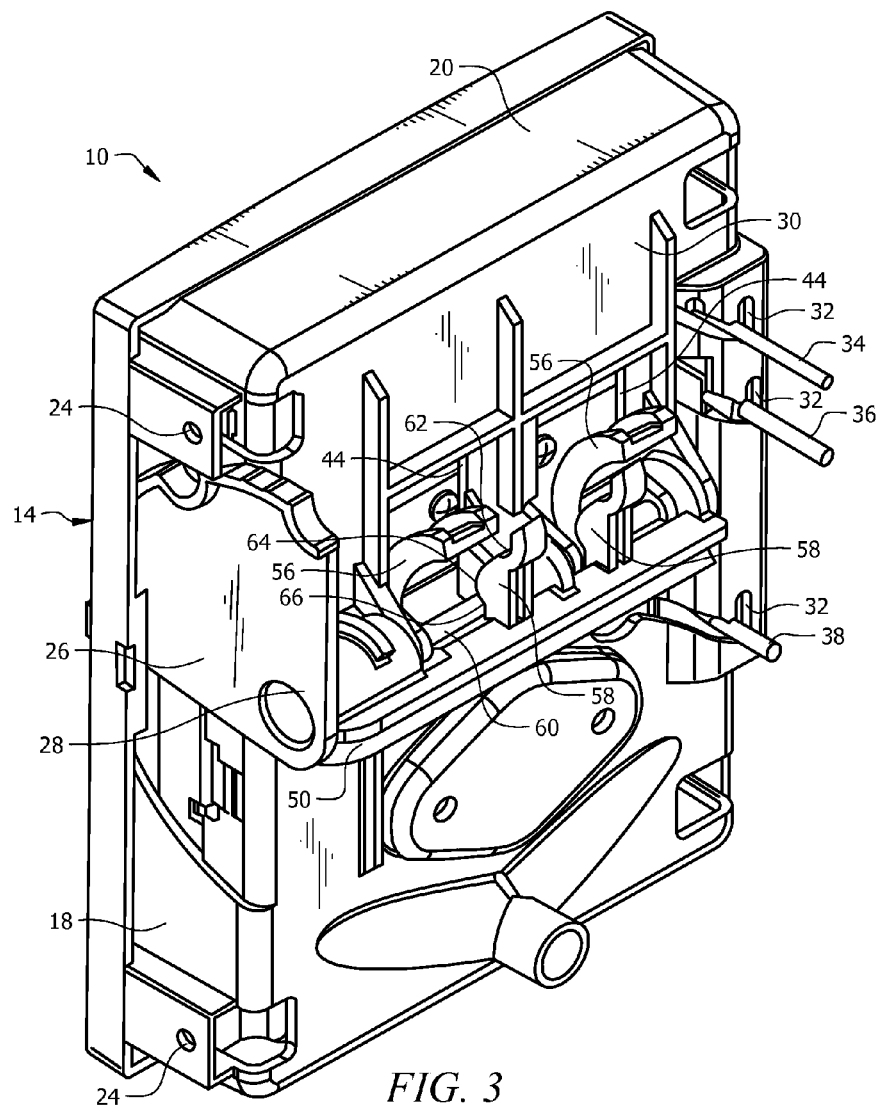
FIG. 3 is another rear isometric view of a panel dock with an electronic device in an engaged position.

FIG. 3 is another rear isometric view of a panel dock 10 with an electronic device 12 (not visible in this view) in an engaged position. Side 18 is clearly shown with mounting holes 24 and thumb wheel 26 extending through face 14. Fingers 58 are shown to have a trapping indent 62 near a distal end, a retraction profile 64 below the trapping indent 62, and a retaining indent 66 near the junction of finger 58 and shaft 50. The trapping indent 62 allows a bar to be trapped between the finger 58 and arm 56 when the retainer is rotated in to a disengaged position as shown below. In the disengaged position the arms 56 and fingers 58 extend through holes 44 in the rear 30 to engage bar 60. Once the bar 60 is trapped between the arm 56 and finger 58 in the trapping indent 62 the retainer 28 may be rotated thus drawing the arms 56, fingers 58, and trapped bars 60 through holes 44 in the rear 30. As retainer 28 is rotated bars 60 slide along retracting profile 64 and into retaining indent 66. The retraction rate and retention of bars 60 are controlled by the shapes of fingers 58 and arms 56.

Figure 4:
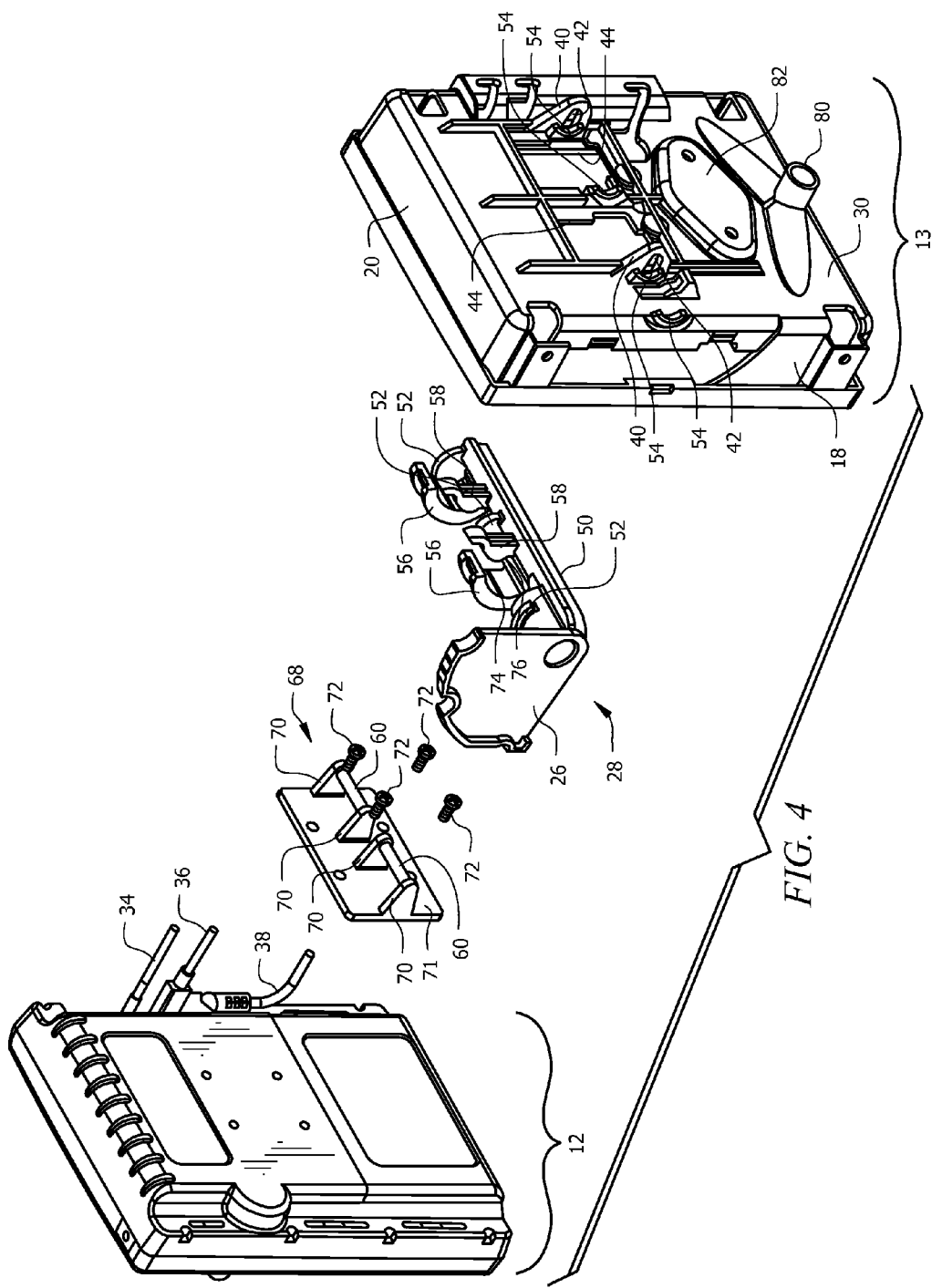
FIG. 4 is an exploded view of FIG. 3.

FIG. 4 is an exploded view of FIG. 3. A bracket has bar supports 70 and bars 60. Bar supports 70 extend from a plate 71. Plate 71 is attached to electronic device with fasteners 72. As shown, fasteners 72 are screws sized to fit in preexisting holes in electronic device 12. Other fasteners 72 could be used as appropriate, such as adhesives, hook and loop systems, or rivets, but screws allow simple attachment and detachment without damage to the electronic device 12.

Arms 56 each have a retraction profile 74 and retaining indent 76 to work with the corresponding features of fingers 58.

Rear 30 of panel dock 10 is more clearly visible in this view. Bearing surfaces 54 and holes 44 are shown aligned with retainer supports 40. Air vent 80 is molded into rear 30 and allows for the addition of an air supply hose to cool electronic device 12 if necessary. Mounting plate 82 is molded into rear 30 to allow for alternate mounting means.

Figure 5:
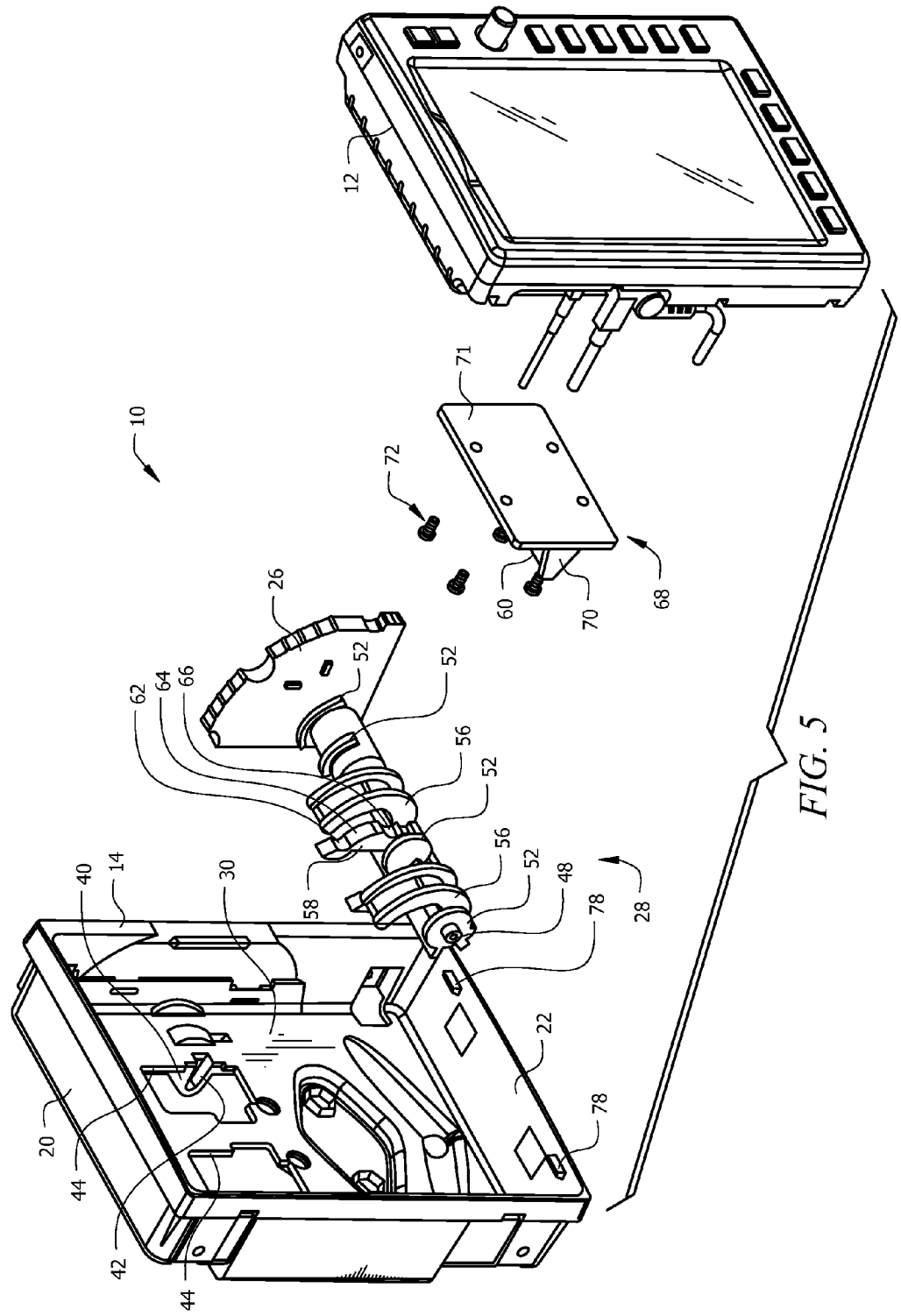
FIG. 5 is an exploded view of FIG. 1.

FIG. 5 is an exploded view of FIG. 1. This view gives another perspective on retainer 28 and in particular shows the location of pins 48, cams 52, and the thumb wheel 26.

Another view of fingers 58 is also provided, clearly showing trapping indent 62, retraction profile 64, and retaining indent 66.

Bottom 22 extend from face 14 to rear 30 opposite top 20 and includes tabs 78. Tabs 78 engage openings in the bottom of electronic device 12. Electronic device 12 is placed into panel dock 10 bottom first to engage tabs 78 and then is pushed rearward such that bars 60 snap between arms 56 and fingers 58 into trapping indent 62 of fingers 58.

Figure 6:
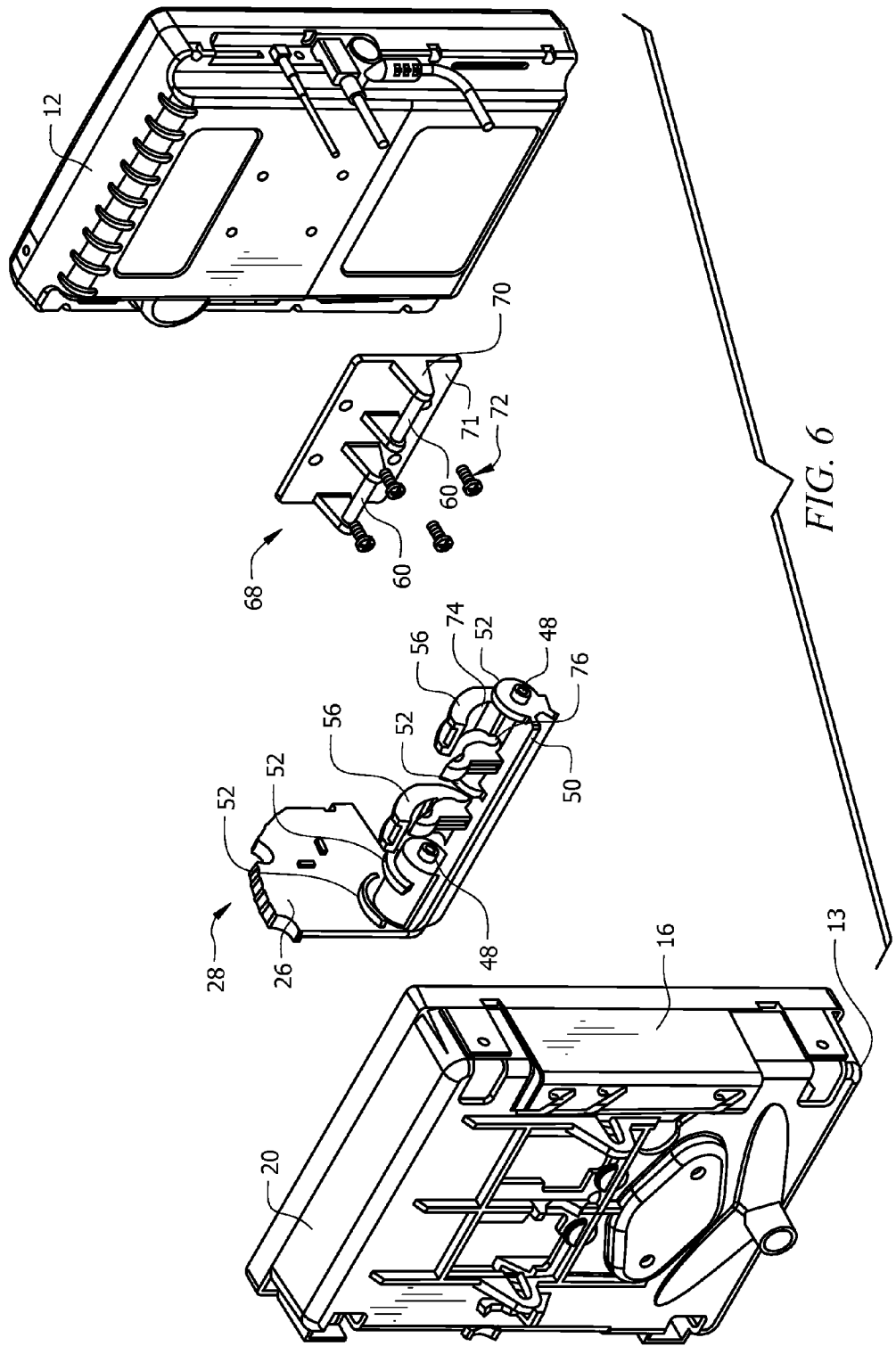
FIG. 6 is an exploded view of FIG. 2.

FIG. 6 is an exploded view of FIG. 2 more clearly showing both pins 48 and all four cams 52.

Figure 7:
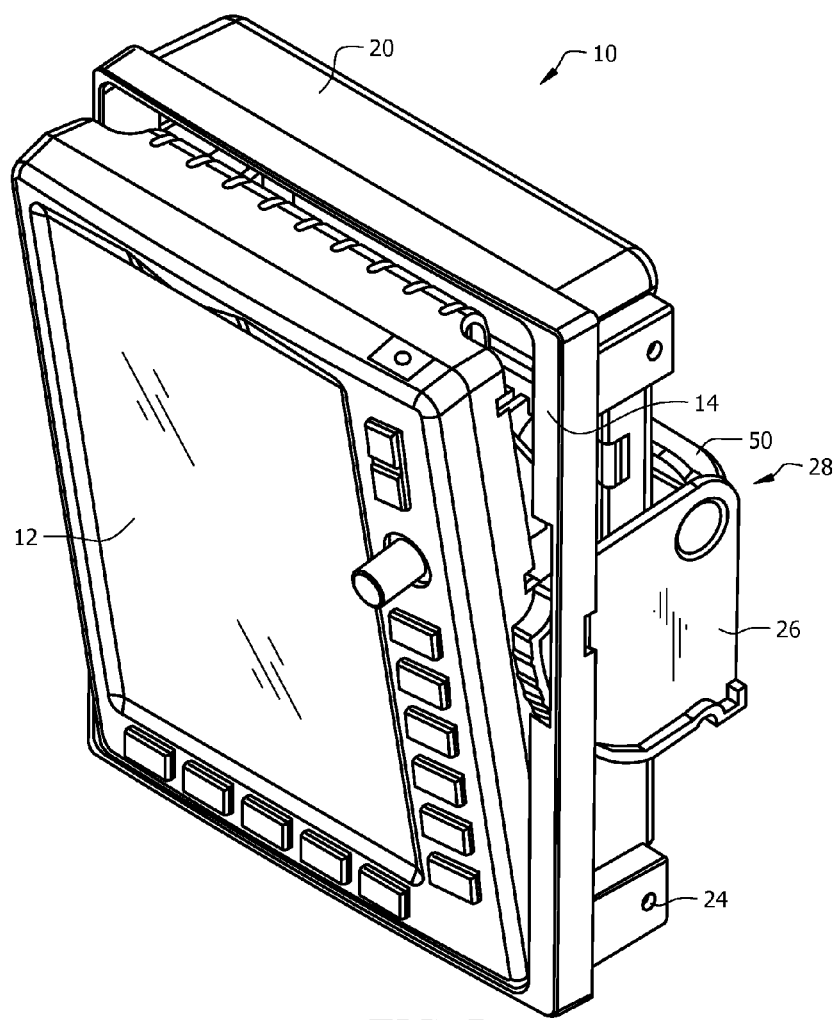
FIG. 7 is an isometric frontal view of a panel dock with an electronic device in a disengaged position.

FIG. 7 is an isometric frontal view of a panel dock 10 with an electronic device 12 in a disengaged position. Tabs 78 (not visible in this view) are engaging the bottom of electronic device 12 and bars 60 (not visible in this view) are trapped in trapping indent 62 (not visible in this view). Electronic device 12 may be held in this position by the tabs 78 and indents 62 indefinitely, thus allowing for access controls or ports on electronic device that may be hidden once electronic device 12 is in an engaged position. Tabs 78 and indents 62 secure electronic device 12 in the disengaged position such that device 12 does not fall loose upon rotation of thumb wheel 26.

Figure 8:
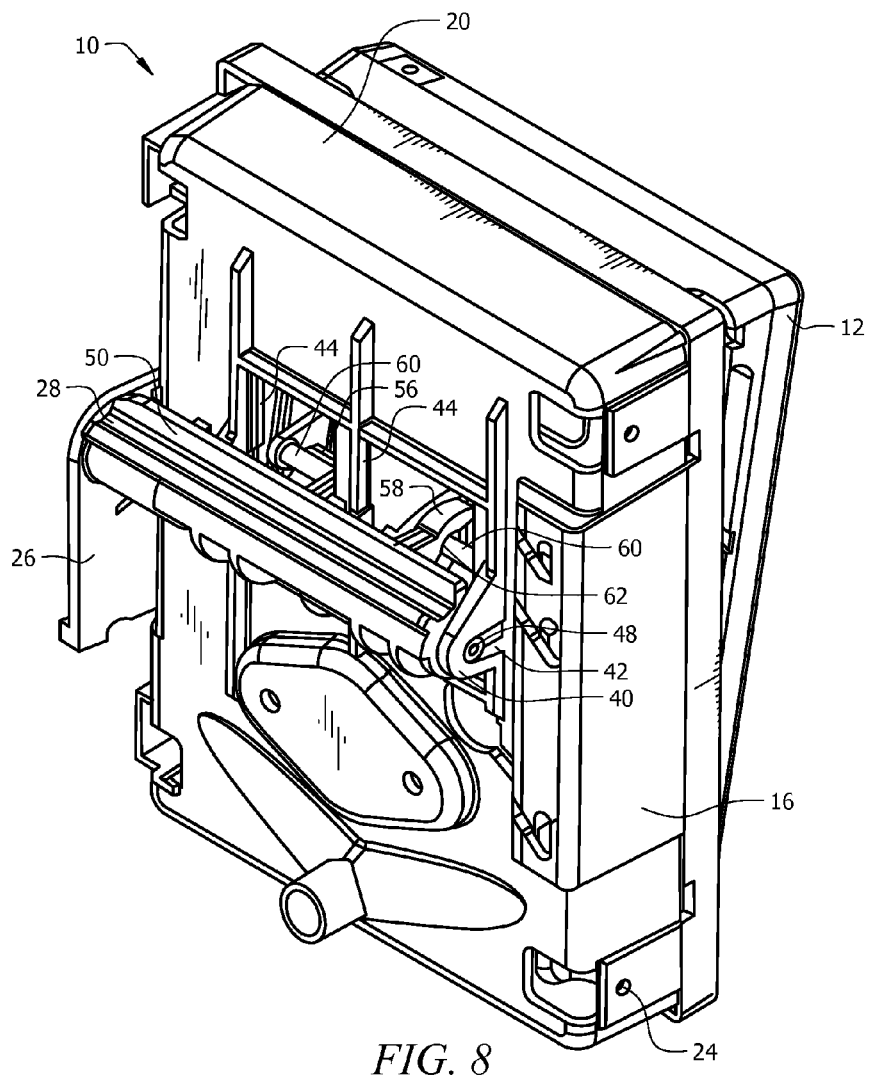
FIG. 8 is an isometric rear view of a panel dock with an electronic device in a disengaged position.

FIG. 8 is an isometric rear view of a panel dock 10 with an electronic device 12 in a disengaged position. Thumb wheel 26 is rotated along with shaft 50 such that fingers 58 and arms 56 extend through the holes 44 in rear 30 to engage bars 60 pin 48 engages slot 42 of retainer support 40 to allow rotation of retainer 28.

Figure 9:
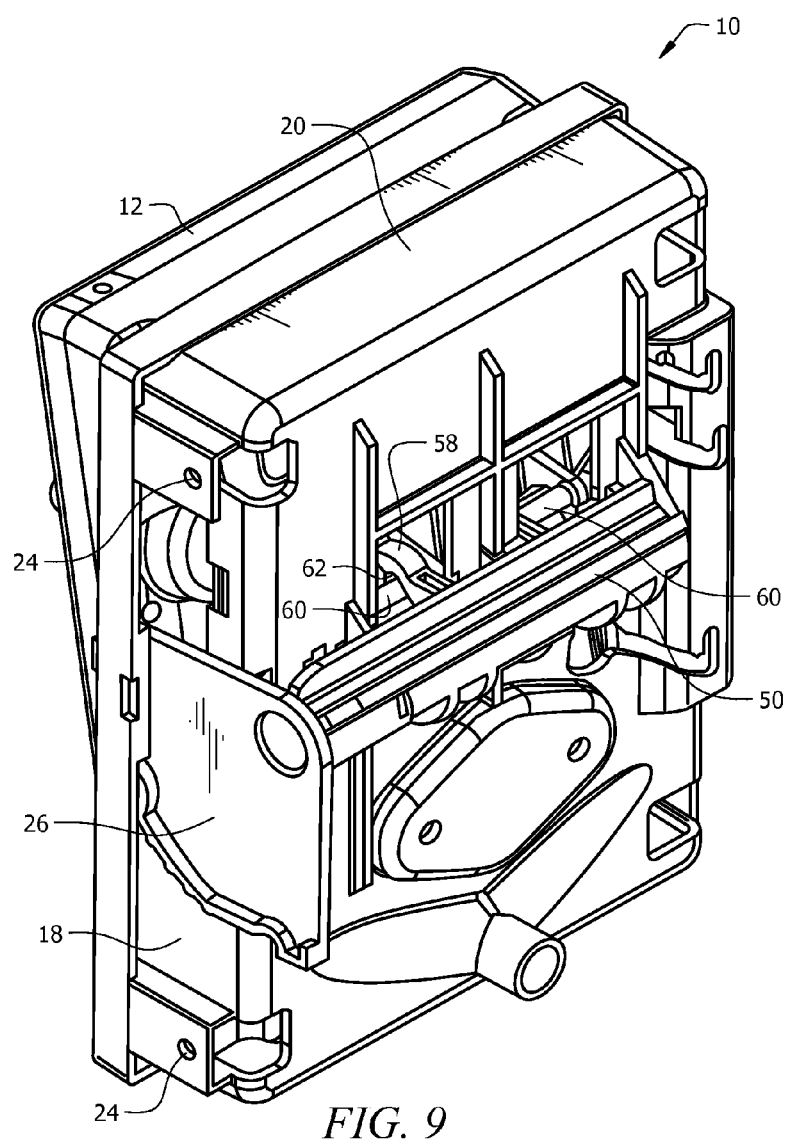
FIG. 9 is another isometric rear view of a panel dock with an electronic device in a disengaged position.

FIG. 9 is another isometric rear view of a panel dock 10 with an electronic device 12 in a disengaged position.

While this disclosure has described a certain embodiment and generally associated methods, alterations and permutations of this embodiment and methods will be apparent to those skilled in the art. Accordingly, the above description of an example embodiment does not define or constrain this disclosure. Other changes, substitutions, and alterations are also possible without departing from the spirit and scope of this disclosure, as defined by the following claims.

What is claimed is:

1. A panel dock comprising:
   a body comprising a face and a rear, two opposing sides extending rearward from the face to the rear;
   a retainer rotably secured to the rear of the body, the retainer including a shaft having at least one arm extending from the shaft and at least one finger extending from the shaft, a thumb wheel attached to the shaft a portion of the thumb wheel extending beyond the face of the body; and
   a bracket attachable to an electronic device; the bracket including a bar sized to be secured between the arm and the finger;
   wherein the rear includes holes aligned with the fingers and arms such that rotation of the retainer allows extension of the fingers and the arms through the holes.

2. The panel dock of claim 1 further comprising tabs along a bottom surface extending between the two opposing sides.

3. The panel dock of claim 1 further comprising keyholes in the body to allow wires to extend through the body.

4. The panel dock of claim 1 further comprising smooth semi-circular bearing surfaces on the rear of the body and smooth semi-circular cams along the shaft aligned with the bearing surfaces when the retainer is attached to the body.

5. The panel dock of claim 1 further comprising retainer supports extending from the rear with a slot in each retainer support and pins in the retainer aligned with the slots when the retainer is attached to the body.

6. The panel dock of claim 1 further comprising: smooth semi-circular bearing surfaces on the rear of the body and smooth semi-circular cams along the shaft aligned with the bearing surfaces when the retainer is attached to the body; and retainer supports extending from the rear with a slot in each retainer support and pins in the retainer aligned with the slots when the retainer is attached to the body.

* * * * *